(12) United States Patent
Li et al.

(10) Patent No.: US 6,509,264 B1
(45) Date of Patent: Jan. 21, 2003

(54) METHOD TO FORM SELF-ALIGNED SILICIDE WITH REDUCED SHEET RESISTANCE

(75) Inventors: Weining Li, Singapore (SG); Yung Tao Lin, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/537,480

(22) Filed: Mar. 30, 2000

(51) Int. Cl.$^7$ .............................. H01L 21/44
(52) U.S. Cl. ................ 438/682; 438/305; 438/596; 438/664; 438/683
(58) Field of Search .................. 438/305, 596, 438/585, 655, 618, 683, 664, 682

(56) References Cited

U.S. PATENT DOCUMENTS

| | | | |
|---|---|---|---|
| 5,196,360 A | * 3/1993 | Doan et al. | 437/41 |
| 5,208,472 A | 5/1993 | Su et al. | 257/344 |
| 5,668,065 A | 9/1997 | Lin | 438/303 |
| 5,747,373 A | 5/1998 | Yu | 438/305 |
| 5,858,849 A | * 1/1999 | Chen | 438/305 |
| 5,869,396 A | 2/1999 | Pam et al. | 438/647 |
| 5,913,124 A | 6/1999 | Lin et al. | 438/302 |
| 5,923,986 A | 7/1999 | Shen | 438/303 |
| 6,010,954 A | * 1/2000 | Ho et al. | 438/596 |
| 6,117,761 A | * 9/2000 | Manning | 438/618 |
| 6,150,264 A | * 11/2000 | Chen et al. | 438/655 |
| 6,169,017 B1 | * 1/2001 | Lee | 438/585 |
| 6,461,951 B1 | * 10/2002 | Besser et al. | 438/592 |
| 2002/0048939 A1 | * 4/2002 | Lee | 438/649 |
| 2002/0064919 A1 | * 5/2002 | Wang | 438/305 |

\* cited by examiner

*Primary Examiner*—Matthew Smith
*Assistant Examiner*—Renzo N. Rocchegiani
(74) *Attorney, Agent, or Firm*—George O. Saile; Rosemary L. S. Pike; Douglas R. Schnabel

(57) ABSTRACT

A new method of forming MOS transistors with self-aligned silicide has been achieved. A gate oxide layer is formed overlying a semiconductor substrate. A polysilicon layer is deposited. The polysilicon layer and the gate oxide layer are patterned to form gates. Ions are implanted to form lightly doped drain regions. A dielectric layer is deposited. The dielectric layer is polished down to expose the top surface of the gates. The dielectric layer is then anisotropically etched down to form dielectric sidewall spacers. The dielectric sidewall spacers cover a portion of the vertical sidewalls of the gates while exposing a portion of the vertical sidewalls of the gates. Ions are implanted to form source and drain regions. A metal layer is deposited. Contact surfaces are formed between the metal layer with: the exposed top surfaces of the gates, the exposed portions of the vertical sidewalls of the gates, and the exposed source and drain regions. The integrated circuit device is annealed to react the metal layer and the polysilicon layer and silicon to selectively form a silicide layer in the surface of the polysilicon layer and in the surface of the semiconductor substrate at the contact surfaces. The remaining metal layer is removed to complete the device.

20 Claims, 4 Drawing Sheets

METHOD TO FORM SELF-ALIGNED SILICIDE WITH REDUCED SHEET RESISTANCE

BACKGROUND OF THE INVENTION (1) Field of the Invention

The invention relates to a method of fabricating semiconductor structures, and more particularly, to a method of forming self-aligned silicide with reduced sheet resistance in the manufacture of an integrated circuit device.

(2) Description of the Prior Art

Metal silicides, or simply, silicides, are formed by the reaction of a metal layer, such as titanium or cobalt, with silicon or polysilicon. In MOS processes of the current art, silicide layers are used to reduce the resistivity of polysilicon lines and the contact resistance of polysilicon gates and silicon source and drain regions. A particular type of silicide process is called self-aligned silicide, or salicide. In a salicide process, the silicide layer is selectively formed on, for example, the polysilicon gates and the silicon source and drain regions, without a silicide masking or etching step. The salicide process offers the benefits of silicide with little additional processing complexity.

Referring now to FIG. 1, a prior art salicide process is illustrated. An MOS transistor is formed overlying a semiconductor substrate 10. In a typical processing sequence, a gate oxide layer 18 and a polysilicon layer 22 are deposited overlying the semiconductor substrate 10. The polysilicon layer 22 and the gate oxide layer 18 are patterned to form the gate for the MOS device. Lightly doped drain (LDD) implants are then performed self-aligned to the gate 22 and the shallow trench isolations (STI) 14. Sidewall spacers 30 are then formed from a dielectric material. The heavily doped source and drain implants are then performed self-aligned to the sidewall spacers 30 and the STI 14 to complete the source and drain regions 26. A metal layer 34, such as titanium or cobalt, is then deposited overlying the gate 22, sidewall spacers 30, source and drain regions 26, and STI 14 as shown.

Referring now to FIG. 2, the integrated circuit wafers are then subjected to a high temperature annealing process. During the anneal, the metal layer 34 reacts with the polysilicon layer 22 and the silicon of the semiconductor substrate 10 (in the source and drain regions 26) to form metal silicide 38 and 42. After the anneal, unreacted metal layer 34 is removed in a wet chemical rinse.

The key advantage of the salicide process can be seen. The metal silicide layer 38 and 42 has formed only in the polysilicon gate 22 and the source and drain regions 26, respectively. No masking step was used. Therefore, the silicide is said to have formed in a self-aligned fashion. The presence of the metal silicide layer 38 and 42 reduces the contact resistance of both the polysilicon gate 22 and the source and drain regions 26. In addition, the metal silicide 38 reduces the sheet resistance of the polysilicon 22.

As MOS processes continue to shrink, the critical dimension (CD) for the polysilicon lines 22 is reduced. The width L1 of the polysilicon lines 22, determines the length of the MOS transistors. By reducing transistor length, packing densities and switching speeds can be increased. However, as the width L1 of the polysilicon lines 22 has been reduced, the sheet resistance of the salicided polysilicon has increased. Keeping the sheet resistance of the salicided polysilicon low while shrinking the width to the deep sub-micron regime is an important challenge in the art.

Several prior art approaches disclose methods to form self-aligned silicide in the manufacture of integrated circuit devices. U.S. Pat. No. 5,913,124 to Lin et al discloses a method to form self-aligned silicide for MOS transistors. A tilt-angle ion implant is used to deepen the source and drain regions near the STI regions. The STI are over-etched during the gate spacer etch to create additional silicide contact area. U.S. Pat. No. 5,923,986 to Shen teaches a self-aligned silicide method. After formation of first gate spacers, additional "0.5" spacers are formed on the first gate spacers. The combined spacer profile forms a discontinuous step that prevents the formation of silicide shorts. U.S. Pat. No. 5,208,472 to Su et al discloses a self-aligned silicide process. A double layered sidewall spacer is used to create the LDD and source/drain offsets and to improve the process capability. U.S. Pat. No. 5,668,065 to Lin teaches a process to simultaneously form self-aligned contacts, silicide, and local interconnects. An amorphous silicon layer is selectively deposited and then converted to silicide. U.S. Pat. No. 5,747,373 to Yu discloses a self-aligned silicide process. A double layer sidewall is formed using silicon dioxide and silicon nitride. U.S. Pat. No. 5,869,369 to Pan et al shows a polycide gate electrode process.

SUMMARY OF THE INVENTION

A principal object of the present invention is to provide an effective and very manufacturable method to form self-aligned silicide in the manufacture of integrated circuits.

A further object of the present invention is to provide a method to increase the silicide layer surface area in polysilicon lines and to thereby reduce the sheet resistivity of those polysilicon lines.

Another further object of the present invention is to form an improved self-aligned silicide by forming unique dielectric sidewall spacers using a polish down of the dielectric layer before etching the dielectric sidewall spacers.

Yet another object of the present invention is to provide a self-aligned silicide MOS transistor device with improved gate resistance.

In accordance with the objects of this invention, a new method of forming MOS transistors with self-aligned silicide in the manufacture of an integrated circuit device has been achieved. A semiconductor substrate is provided. A gate oxide layer is formed overlying the semiconductor substrate. A polysilicon layer is deposited overlying the gate oxide layer. The polysilicon layer and the gate oxide layer are patterned to form gates. Ions are implanted into the semiconductor substrate to form lightly doped drain regions. A dielectric layer is deposited overlying the gates and the semiconductor substrate. The dielectric layer is polished down to expose the top surface of the gates. The dielectric layer is then anisotropically etched down to form dielectric sidewall spacers. The dielectric sidewall spacers cover a portion of the vertical sidewalls of the gates while exposing a portion of the vertical sidewalls of the gates. Ions are implanted into the semiconductor substrate to form source and drain regions. A metal layer is deposited overlying the gates, the dielectric sidewall spacers, and the semiconductor substrate. Contact surfaces are formed between the metal layer and the exposed top surfaces of the gates, between the metal layer and the exposed portions of the vertical sidewalls of the gates, and between the metal layer and the semiconductor substrate in the source and drain regions. The integrated circuit device is annealed to react the metal layer and the polysilicon layer and to react the metal layer and the semiconductor substrate to selectively form a silicide layer in the surface of the polysilicon layer and in the surface of the semiconductor substrate at the contact surfaces. The remaining metal layer is removed to complete the MOS transistors with self-aligned silicide in the manufacture of the integrated circuit device.

Also in accordance with the objects of this invention, a self-aligned silicide MOS transistor device is achieved. A gate comprises first a gate oxide layer overlying a semiconductor substrate. A polysilicon layer overlies the gate oxide layer. Dielectric sidewall spacers cover a portion of the vertical sidewalls of the polysilicon layer while exposing a portion of the vertical sidewalls of the polysilicon layer. A silicide layer is in the surface of the exposed portions of the vertical sidewalls and in the top surface of the polysilicon layer to complete the gate. The drain and source junctions each comprise first a lightly doped drain region in the semiconductor substrate. The lightly doped drain region is self-aligned to the polysilicon layer. A heavily doped region is in the semiconductor substrate. The heavily doped region is self-aligned to the dielectric sidewall spacers. A silicide layer is in the surface of the heavily doped region to complete the source and drain junctions.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of MOS transistors with self-aligned silicide in the manufacture of an integrated circuit device. In addition, the present invention can be applied to form a silicide layer on any polysilicon line in the integrated circuit device. It should be clear to those experienced in the art that the present invention can be applied and extended without deviating from the scope of the present invention.

Figure 1:
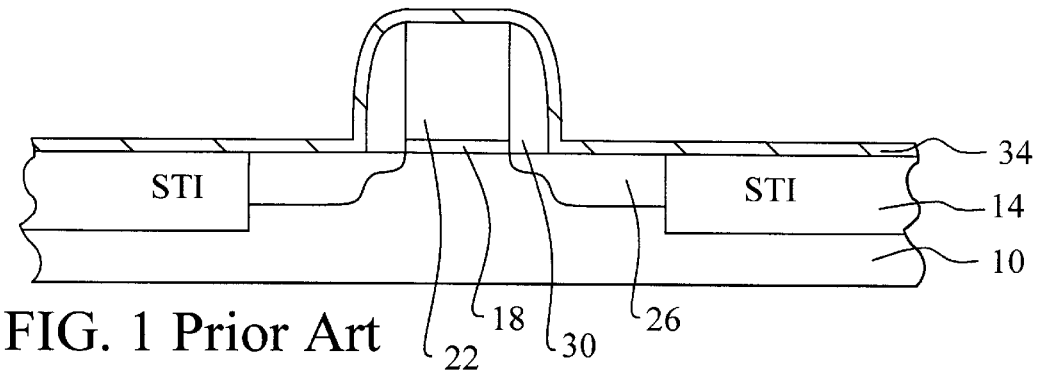
FIGS. 1 and 2 schematically illustrate in cross-section a prior art self-aligned silicide process.
Figure 2:
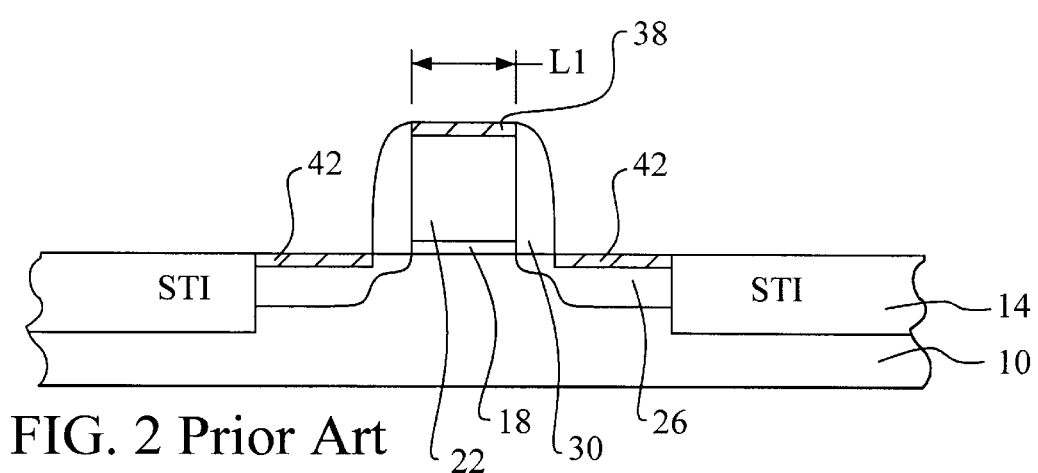
Figure 3:
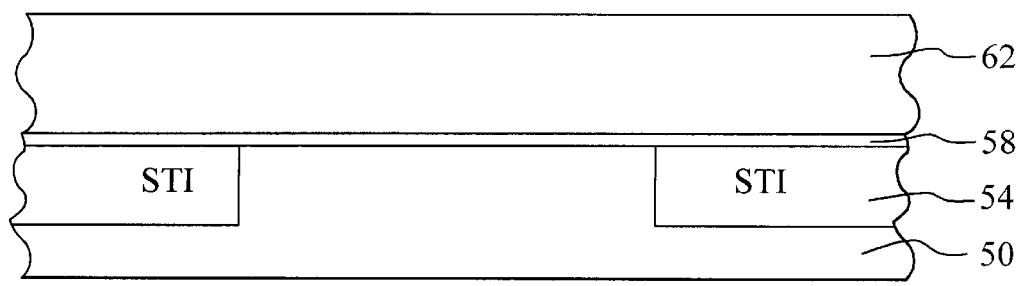
FIGS. 3 through 11 schematically illustrate in cross-sectional representation the preferred embodiment of the present invention.

Referring now particularly to FIG. 3, there is shown a cross-sectional representation of the preferred embodiment of the present invention. A semiconductor substrate 50 is provided. The semiconductor substrate 50 comprises monocrystalline silicon. Shallow trench isolations (STI) 54 are formed in the semiconductor substrate 50 to define the active regions of the integrated circuit device. Alternatively, field oxide regions, formed using a local oxidation of silicon (LOCOS) technique, could be used in place of the STI regions 54.

A gate oxide layer 58 is formed overlying the semiconductor substrate 50. The gate oxide layer 58 preferably comprises silicon dioxide that may be formed by thermal oxidation or by chemical vapor deposition (CVD). The gate oxide layer 58 of the preferred embodiment is formed to a thickness of between about 20 Angstroms and 300 Angstroms.

A polysilicon layer 62 is deposited overlying the gate oxide layer 58. The polysilicon layer 62 will form the gate for the transistor. The polysilicon layer 62 is deposited using, for example, a low-pressure chemical vapor deposition (LPCVD) process. The polysilicon layer 62 is preferably deposited to a thickness of between about 1,000 Angstroms and 5,000 Angstroms.

Figure 4:
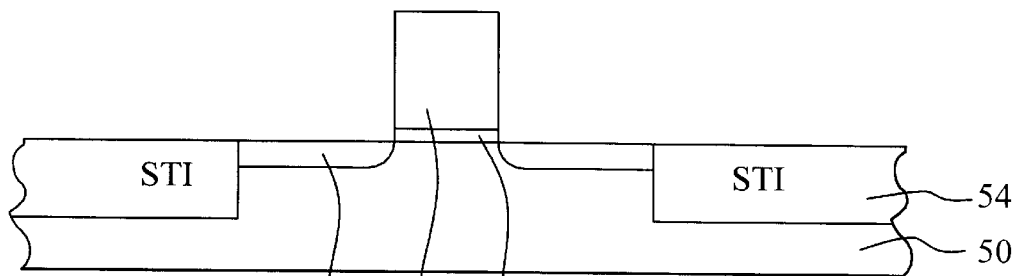

Referring now to FIG. 4, the polysilicon layer 62 and the gate oxide layer 58 are patterned to form the gate for the transistor. The patterning step may be performed using a conventional photolithographic mask and etch sequence. In this scheme, a photoresist material is deposited overlying the polysilicon layer 62. The photoresist material is exposed to light through a patterned mask and then developed. The remaining photoresist forms a surface mask which allows the polysilicon layer 62 and the gate oxide layer 58 to be selectively etched away. The remaining photoresist layer is then stripped.

Following the definition of the gate 62, ions are implanted into the semiconductor substrate 50 to form lightly doped drain regions 66 for the transistor. Lightly doped drain (LDD) regions 66 are used to reduce short-channel effects, such as the hot carrier effect, on very short channel length MOS devices. The LDD 66 are implanted self-aligned to the gates 62 and the STI regions 54.

Figure 5:
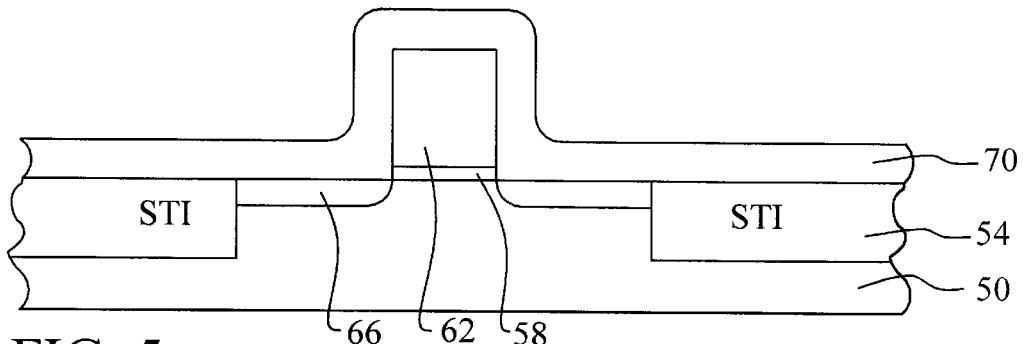

Referring now to FIG. 5, an important step in the method of the present invention is illustrated. A dielectric layer 70 is deposited overlying the gates 62 and the semiconductor substrate 50. The dielectric layer 70 will form the sidewall spacers for the transistor gates 62. The dielectric layer 70 comprises either silicon dioxide or silicon nitride. The dielectric layer 70 may be deposited using a CVD or LPCVD process. The thickness of the dielectric layer 70 is important because it roughly determines the offset of the heavily doped source and drain regions from the edges of the transistor channel region. In the preferred embodiment, the dielectric layer 70 is deposited to a thickness of between about 100 Angstroms and 5,000 Angstroms.

Figure 6:
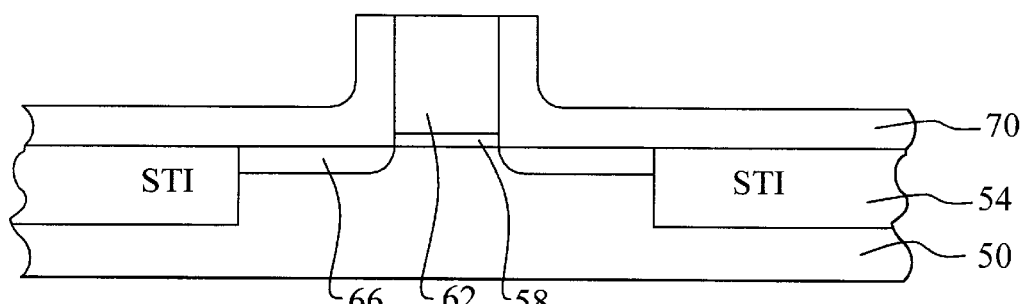

Referring now to FIG. 6, another important feature of the present invention is illustrated. The dielectric layer 70 is polished down to expose the top surface of the gates 62. The novel polishing down step removes the dielectric layer 70 that protrudes up over the gates 62. By removing the dielectric layer 70 from the top surface of the gates 62, the subsequent etch down step will form a unique and advantageous sidewall profile. The polishing down step is preferably performed using a chemical mechanical polish.

Figure 7:
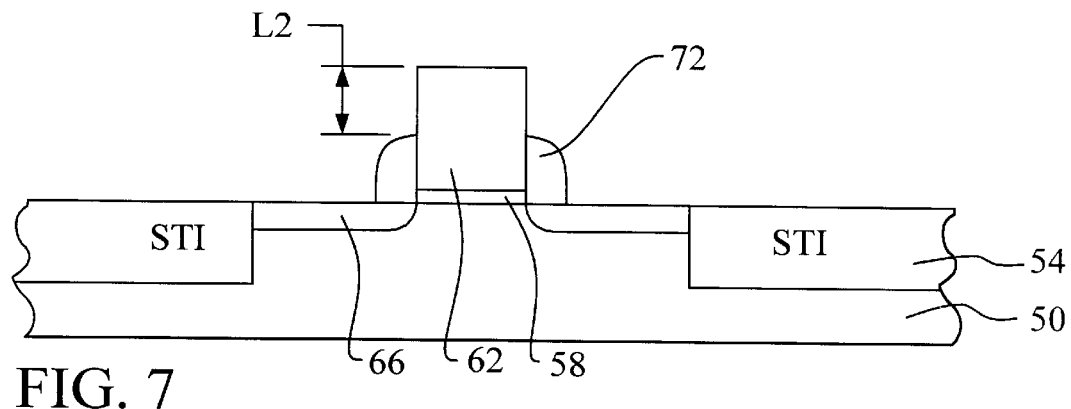

Referring now to FIG. 7, another important feature of the present invention is illustrated. The dielectric layer 70 is anisotropically etched down to form dielectric sidewall spacers 72. Note that the dielectric layer 70 was already polished down to the top surface of the gates 62 prior to the etch. The etching step therefore removes a portion of the sidewall height before the dielectric layer 70 overlying the bulk of the semiconductor substrate 50 is removed. The anisotropic etching process uses a plasma etch comprising an etching chemistry of $Cl_2$, HBr, $O_2$, $CF_4$, and $CHF_3$.

The dielectric sidewall spacers 72 thus formed have a unique and advantageous profile. A portion of the vertical sidewall of the gates 62 is exposed during the etching process. This exposed surface will allow a significant amount of additional silicide layer to be formed in the surface of the gates 62. In the preferred embodiment, the exposed vertical sidewall has a length L2 of between about 100 Angstroms and 5,000 Angstroms depending on the deposited thickness of the dielectric layer 70 and the amount of spacer overetch. In addition, the dielectric sidewall spacer 72 has a sufficient width to facilitate creation of source/drain standoffs. Finally, the dielectric sidewall spacer 72 has a sufficient height to prevent silicide shorting across the drain and gate or across the source and gate.

Figure 8:
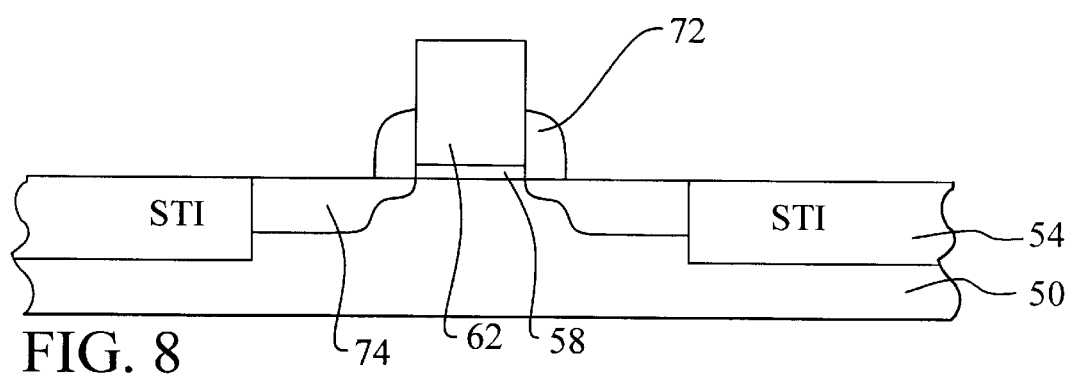

Referring now to FIG. 8, heavily doped source and drain regions are formed in the semiconductor substrate 50. Ions are implanted into the semiconductor substrate using the gate 62, the dielectric sidewall spacers 72, and the STI 54 as implant blocks. Thus, the source and drain regions are formed self-aligned to the dielectric sidewall spacers 72. The heavily doped source and drain regions are herein shown combined with the previously formed lightly doped drains to create a combined junction profile 74.

Figure 9:
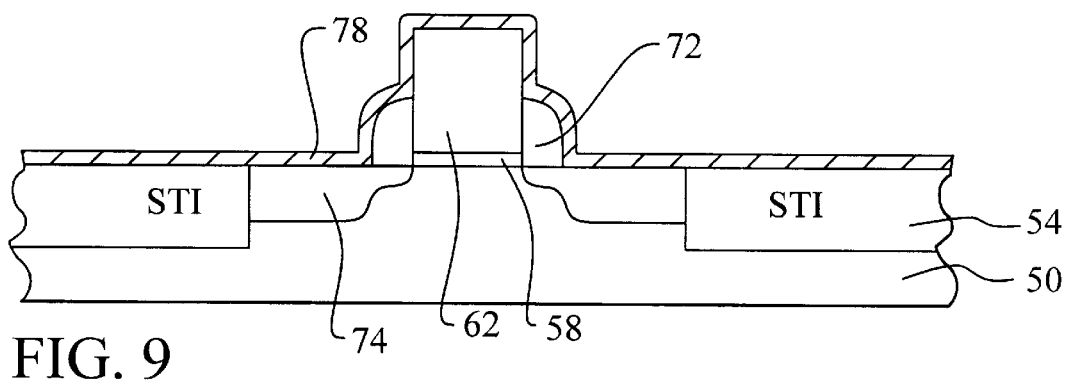

Referring now to FIG. 9, another important feature of the present invention is illustrated. A metal layer 78 is deposited overlying the gates 62, the dielectric sidewall spacers 72, and the semiconductor substrate 50. Note how the metal layer 78 deposition forms contact surfaces between the metal layer 78 and the tops of the gates 62, between the metal layer 78 and the exposed portions of the vertical sidewalls of the gates 62, and between the metal layer 78 and the semiconductor substrate 50 in the source and drain regions 74. The metal-polysilicon and metal-silicon reaction that forms silicide will occur at these contact surfaces during the anneal process. The metal layer 78 may comprise, for example, either titanium or cobalt. The metal layer 78 may be deposited by a physical vapor deposition, or sputtering, process. In the preferred embodiment, the metal layer 78 is deposited to a thickness of between about 100 Angstroms and 3,000 Angstroms.

Figure 10:
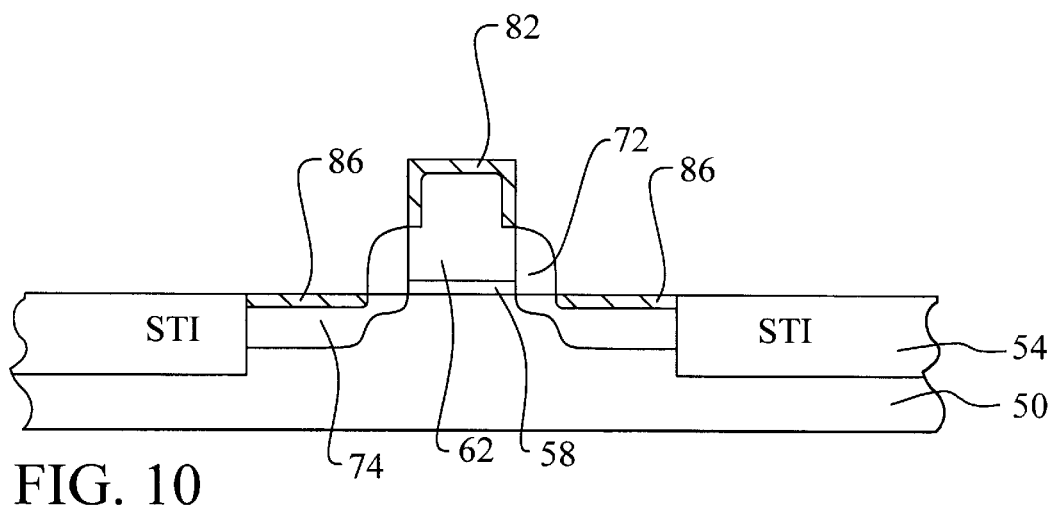

Referring now to FIG. 10, several important aspects of the present invention are presented. The integrated circuit device is annealed to create silicide layer 82 and silicide layer 86 in the surface of the polysilicon layer 62 and in the surface of the source and drain regions 74, respectively. The anneal step facilitates the reaction of the metal layer 78 and the polysilicon layer 62 and the metal layer 78 and the semiconductor substrate 50 at the contact surfaces. This annealing step, sometimes called sintering, is performed at a temperature of between about 500 degrees C. and 1,200 degrees C. for between about 0.1 minutes and 1 minute. The reaction produces a metal silicide ($M_xSi_y$) in the surface of the polysilicon or silicon (semiconductor substrate). If, for example, titanium is used for the metal layer 78, the reaction proceeds: $Ti+Si \rightarrow TiSi_2$.

After the annealing operation, the unreacted metal layer 78 is removed. The metal layer 78 is preferably removed by a wet chemical rinse that lifts away the unreacted metal while not attacking the silicide layer 82, 86. Because the silicide layer 82, 86 is only formed in the desired areas, while the excess metal layer 78 is merely rinsed away, the process of the present invention may be deemed a self-aligned silicide, or salicide, process. The completion of this step also completes the self-aligned silicide MOS transistor in the manufacture of the integrated circuit device. In the preferred embodiment, the wet chemical rinse comprises: $NH_3$, $NH_4OH$, $H_2O_2$, and $H_2O$.

The silicide layer 82 formed in the surface of the polysilicon layer 62 of the gate will reduce the contact resistance of the gate and will reduce the sheet resistance of the polysilicon line. The silicide layer 86 formed in the surface of the semiconductor substrate 50 in the source and drain regions 74 will likewise reduce the contact resistance.

Note that the sheet resistance of the polysilicon layer 62 is further reduced by the fact that the silicide layer 82 is formed, not only on the top surface, but also on the exposed vertical sidewalls. This fact gives the method and device of the present invention a significant advantage over that of the prior art example.

Figure 11:
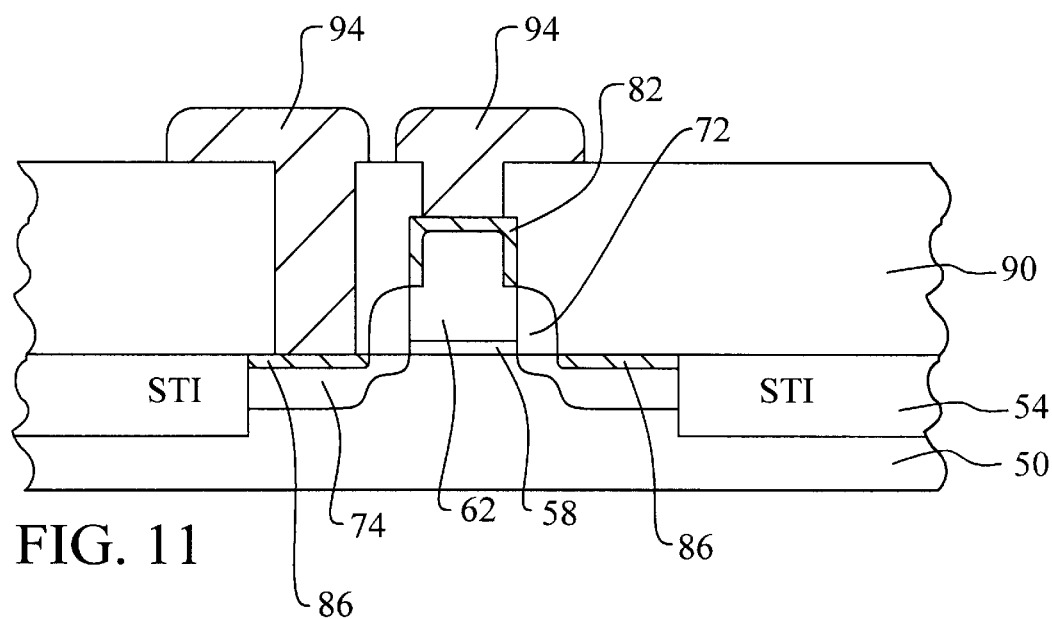

Referring now to FIG. 11, an exemplary interlevel dielectric layer 90 is deposited overlying the completed device. Contact openings are formed in the interlevel dielectric layer 90. A metal interconnect layer 94 is deposited overlying the interlevel dielectric layer 90 and filling the contact openings. The metal interconnect layer 94 is patterned to form interconnect patterns as shown. Note that the metal interconnect layer 94 contacts the source/drain region 74 at the silicide layer 86. This contact approach reduces the contact resistance of the source/drain region. Likewise, the silicide layer 82 of the gate 62 reduces the contact resistance of the gate.

Again referring to FIG. 11, the completed self-aligned silicide MOS transistor device may now be described. The gate of the device comprises first a gate oxide layer 58 overlying a semiconductor substrate 50. A polysilicon layer 62 overlies the gate oxide layer 58. Dielectric sidewall spacers 72 cover an upper portion of the vertical sidewalls of the polysilicon layer 62 while exposing a lower portion of the vertical sidewalls of the polysilicon layer 62. A silicide layer 82 is in the surface of the exposed portions of the vertical sidewalls and in the top surface of the polysilicon layer 62 to complete the gate. The drain and source junctions 74 each comprise first a lightly doped drain region in the semiconductor substrate 50. The lightly doped drain region is self-aligned to the polysilicon layer 62. A heavily doped region is in the semiconductor substrate 50. The heavily doped region is self-aligned to the dielectric sidewall spacers 72. A silicide layer 86 is in the surface of the heavily doped region to complete the source and drain junctions 74.

As shown in the preferred embodiments, the present invention provides a very manufacturable process for forming a self-aligned silicide MOS transistor device in an integrated circuit device. The spacer dielectric layer is polished down to the top of the gate prior to the spacer etch. The dielectric sidewall spacers are thus uniquely formed so that a portion of the vertical sidewall of the gate is covered while a portion is exposed. The silicide layer formed in the surface of the polysilicon gate extends down the vertical sidewalls of the gate. The silicide layer area is thereby increased. In addition, a novel self-aligned silicide MOS transistor device is achieved.

While the invention has been particularly shown and described with reference to the preferred embodiments thereof, it will be understood by those skilled in the art that various changes in form and details may be made without departing from the spirit and scope of the invention.

What is claimed is:

1. A method to form self-aligned silicide with reduced sheet resistance in the manufacture of an integrated circuit device comprising:

providing a semiconductor substrate;

depositing a polysilicon layer overlying said semiconductor substrate;

patterning said polysilicon layer to form polysilicon lines;

forming dielectric sidewall spacers by a method consisting of:

depositing a dielectric layer overlying said polysilicon lines and said semiconductor substrate;

polishing down said dielectric layer to expose the top surface of said polysilicon lines; and thereafter anisotropically etching down said dielectric layer to form said dielectric sidewall spacers covering a lower portion of the vertical sidewalls of said polysilicon lines while exposing an upper portion of the vertical sidewalls of said polysilicon lines;

depositing a metal layer overlying said polysilicon lines, said dielectric sidewall spacers, and said semiconductor substrate and thereby forming contact surfaces between said metal layer and said exposed top surfaces of said polysilicon lines and between said metal layer and said exposed portions of said vertical sidewalls of said polysilicon lines;

annealing the integrated circuit device to react said metal layer and said polysilicon layer to selectively form a silicide layer in the surface of said polysilicon layer at said contact surfaces; and removing remaining metal layer to complete said self-aligned silicide in the manufacture of said integrated circuit device.

2. The method according to claim 1 wherein said dielectric layer comprises one of the group of: silicon dioxide and silicon nitride.

3. The method according to claim 1 wherein said dielectric layer is deposited to a thickness of between about 100 Angstroms and 5,000 Angstroms.

4. The method according to claim 1 wherein said step of polishing down said dielectric layer is by a chemical mechanical polish.

5. The method according to claim 1 wherein said exposed portions of said vertical sidewalls of said polysilicon lines have a vertical length of between about 100 Angstroms and 5,000 Angstroms.

6. The method according to claim 1 wherein said metal layer comprises one of the group of: titanium and cobalt.

7. The method according to claim 1 wherein said silicide layer is formed to a thickness of between about 100 Angstroms and 3,000 Angstroms.

8. The method according to claim 1 wherein said polysilicon lines form gate electrodes for MOS transistors.

9. A method to form MOS transistors with self-aligned silicide in the manufacture of an integrated circuit device comprising:

providing a semiconductor substrate;

forming a gate oxide layer overlying said semiconductor substrate;

depositing a polysilicon layer overlying said gate oxide layer;

patterning said polysilicon layer and said gate oxide layer to form gates;

thereafter implanting ions into said semiconductor substrate to form lightly doped drain regions;

thereafter forming dielectric sidewall spacers by a method consisting of:
depositing a dielectric layer overlying said gates and said semiconductor substrate;
polishing down said dielectric layer to expose the top surface of said gates; and
thereafter anisotropically etching down said dielectric layer to form said dielectric sidewall spacers covering a lower portion of the vertical sidewalls of said gates while exposing an upper portion of the vertical sidewalls of said gates;

thereafter implanting ions into said semiconductor substrate to form source and drain regions;

thereafter depositing a metal layer overlying said gates, said dielectric sidewall spacers, and said semiconductor substrate and thereby forming contact surfaces between said metal layer and said exposed top surfaces of said gates, between said metal layer and said exposed portions of said vertical sidewalls of said gates, and between said metal layer and said semiconductor substrate in said source and drain regions;

annealing the integrated circuit device to react said metal layer and said polysilicon layer and to react said metal layer and said semiconductor substrate to selectively form a silicide layer in the surface of said polysilicon layer and in the surface of said semiconductor substrate at said contact surfaces; and removing remaining metal layer to complete said MOS transistors with self-aligned silicide in the manufacture of said integrated circuit device.

10. The method according to claim 9 wherein said dielectric layer comprises one of the group of: silicon dioxide and silicon nitride.

11. The method according to claim 9 wherein said dielectric layer is deposited to a thickness of between about 100 Angstroms and 5,000 Angstroms.

12. The method according to claim 9 wherein said step of polishing down said dielectric layer is by a chemical mechanical polish.

13. The method according to claim 9 wherein said exposed portions of said vertical sidewalls of said gates have a vertical length of between about 100 Angstroms and 5,000 Angstroms.

14. The method according to claim 9 wherein said metal layer comprises one of the group of: titanium and cobalt.

15. The method according to claim 9 wherein said silicide layer has a thickness of between about 100 Angstroms and 3,000 Angstroms.

16. A method to form self-aligned silicide with reduced sheet resistance in the manufacture of an integrated circuit device comprising:

providing a semiconductor substrate;

depositing a polysilicon layer overlying said semiconductor substrate;

patterning said polysilicon layer to form polysilicon lines;

forming dielectric sidewall spacers by a method consisting of:
depositing a dielectric layer overlying said polysilicon lines and said semiconductor substrate wherein said dielectric layer comprises one of the group of: silicon dioxide and silicon nitride;
polishing down said dielectric layer to expose the top surface of said polysilicon lines; and
thereafter anisotropically etching down said dielectric layer to form said dielectric sidewall spacers covering a lower portion of the vertical sidewalls of said polysilicon lines while exposing an upper portion of the vertical sidewalls of said polysilicon lines;

depositing a metal layer overlying said polysilicon lines, said dielectric sidewall spacers, and said semiconductor substrate and thereby forming contact surfaces between said metal layer and said exposed top surfaces of said polysilicon lines and between said metal layer and said exposed portions of said vertical sidewalls of said polysilicon lines;

annealing the integrated circuit device to react said metal layer and said polysilicon layer to selectively form a silicide layer in the surface of said polysilicon layer at said contact surfaces; and removing remaining metal layer to complete said self-aligned silicide in the manufacture of said integrated circuit device.

17. The method according to claim 16 wherein said dielectric layer is deposited to a thickness of between about 100 Angstroms and 5,000 Angstroms.

18. The method according to claim 16 wherein said step of polishing down said dielectric layer is by a chemical mechanical polish.

19. The method according to claim 16 wherein said exposed portions of said vertical sidewalls of said polysilicon lines have a vertical length of between about 100 Angstroms and 5,000 Angstroms.

20. The method according to claim 16 wherein said polysilicon lines form gate electrodes for MOS transistors.

* * * * *